(12) United States Patent
Prasad (10) Patent No.: US 6,526,111 B1
(45) Date of Patent: Feb. 25, 2003

(54) METHOD AND APPARATUS FOR PHASE LOCKED LOOP HAVING REDUCED JITTER AND/OR FREQUENCY BIASING

(75) Inventor: Ammisetti V Prasad, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 09/197,615

(22) Filed: Nov. 23, 1998

(51) Int. Cl.⁷ ................................................. H03D 3/24
(52) U.S. Cl. ....................... 375/376; 375/375; 375/374; 327/157
(58) Field of Search .................. 375/376, 374, 375/375, 327; 327/148, 157, 147, 156; 331/57, 1 R, 25, 34, 1 A (56) References Cited

U.S. PATENT DOCUMENTS

| | | | | |
|---|---|---|---|---|
| 5,334,951 A | * | 8/1994 | Hogeboom | ................ 331/1 A |
| 5,475,326 A | * | 12/1995 | Masuda | ...................... 327/157 |
| 5,818,304 A | * | 10/1998 | Hogeboom | .................. 331/11 |

* cited by examiner

Primary Examiner—Phuong Phu
(74) Attorney, Agent, or Firm—Timothy W. Markison (57) ABSTRACT

A phase lock loop includes a phase detector, a charge pump circuit, a controlled oscillator, and a jitter control circuit. The control oscillator may also include a biasing circuit to provide the frequency biasing. The phase detection circuit is operably coupled to receive the reference signal and a feedback signal and to produce therefrom a phase different signal. The phase different signal is provided to the charge pump circuit, which includes a first current source and a second current source. The first current source is dominate when the phase different signal is in a first stage (e.g., charge up) and the second current source is dominate when the phase signal is in the second state (e.g., charge down). The charge pump circuit outputs a representative signal that is provided to the control oscillator which, in response, generates the output signal. The output signal is fed back to the phase detection circuit as the feedback signal. The jitter control circuit is operably coupled to the first and second current sources of the charge pump circuit and is operable to impel the currents of the first and second current sources to substantially match.

13 Claims, 4 Drawing Sheets

METHOD AND APPARATUS FOR PHASE LOCKED LOOP HAVING REDUCED JITTER AND/OR FREQUENCY BIASING

TECHNICAL FIELD OF THE INVENTION

This invention relates generally to clock circuits and more particularly to phase lock loops.

BACKGROUND OF THE INVENTION

Phase lock loops are widely used within clock circuits to produce a clock signal from an incoming reference signal, which may be generated by a crystal oscillator, data rate extraction circuit, etc. In addition, phase lock loops, based on scaling a feedback signal may increase or decrease the frequency of the inputted reference signal. As such, from a single clock reference, such as a crystal oscillator, a plurality of phase lock loops may be coupled thereto to produce a plurality of clock signals. Such is the case in many digital to analog and analog to digital circuits.

As is known, a phase lock loop (PLL) includes a phase detection circuit, a charge pump circuit, a voltage controlled oscillator (or current controlled oscillator), and a feedback circuit. The feedback circuit may provide a scaling factor of one, less than one, or greater than one. When the feedback scaling factor is greater than one, the output frequency of the phase lock loop will be equal to the feedback scaling factor times the frequency of the input reference signal.

In operation, a the phase detection circuit of the PLL receives the reference signal and the feedback signal and produces therefrom a phase difference signal. The phase difference signal is provided to the charge pump, which produces a charge up or charge down signal that is provided to the voltage controlled oscillator (VCO). Depending on whether the charge up or charge down signal is provided to the VCO, the VCO will adjust the frequency of the output signal accordingly. For example, if the frequency of the input signal is greater than the frequency of the feedback signal, the output frequency needs to be increased. To do this, the charge pump produces the charge up signal, which increases the input to the VCO causing the VCO to increase the output frequency. Conversely, when the output frequency needs to be decreased, i.e., due to the frequency of the feedback signal being greater than that of the input reference signal, the charge pump circuit produces the charge down signal causing the VCO to decrease the output frequency.

While phase lock loops have a wide variety of applications, their use is limited due to jitter (i.e., unwanted changes in the output frequency due to component tolerance variations). The component tolerance variation causes slight imbalances within the charge pump circuit, which cause mismatches between the steady-state charge up signal and the steady-state charge down signal. Due to the correct nature of the PLL, it attempts to regulate such imbalances, thereby producing the jitter. To reduce the effects of jitter, many phase lock loops are designed with matching transistors and use enhanced fabrication techniques. While these techniques reduce the jitter, it does not sufficiently limit it in certain applications, such as audio Codecs.

In addition to jitter, phase lock loops experience a start-up delay, during which the output frequency is varying. In a sense, the phase-lock loop is running at maximum gain until it reaches a steady state condition. The start-up delay ranges from a few hundred microseconds to a few hundred milliseconds. In many applications, including audio Codes, this delay produces undesirable results, such as noise pops.

Therefore, a need exists for a phase lock loop that has reduced jitter and/and frequency biasing to reduce start-up delays.

DETAILED DESCRIPTION OF A PREFERRED EMBODIMENT

Generally, the present invention provides a phase lock loop having reduced jitter and/or frequency biasing. The phase lock loop includes a phase detector, a charge pump circuit, a controlled oscillator, and a jitter control circuit. The control oscillator may also include a biasing circuit to provide the frequency biasing. The phase detection circuit is operably coupled to receive the reference signal and a feedback signal and to produce therefrom a phase different signal. The phase different signal is provided to the charge pump circuit, which includes a first current source and a second current source. The first current source is dominate when the phase different signal is in a first stage (e.g., charge up) and the second current source is dominate when the phase signal is in the second state (e.g., charge down). The charge pump circuit outputs a representative signal that is provided to the control oscillator which, in response, generates the output signal. The output signal is fed back to the phase detection circuit as the feedback signal. The jitter control circuit is operably coupled to the first and second current sources of the charge pump circuit and is operable to impel the currents of the first and second current sources to substantially match. With such a phase lock loop, jitter is reduced thereby providing a more stable phase lock loop and clock circuitry, as well as providing for frequency biasing to reduce the start-up delay and frequency transition delays.

Figure 1:
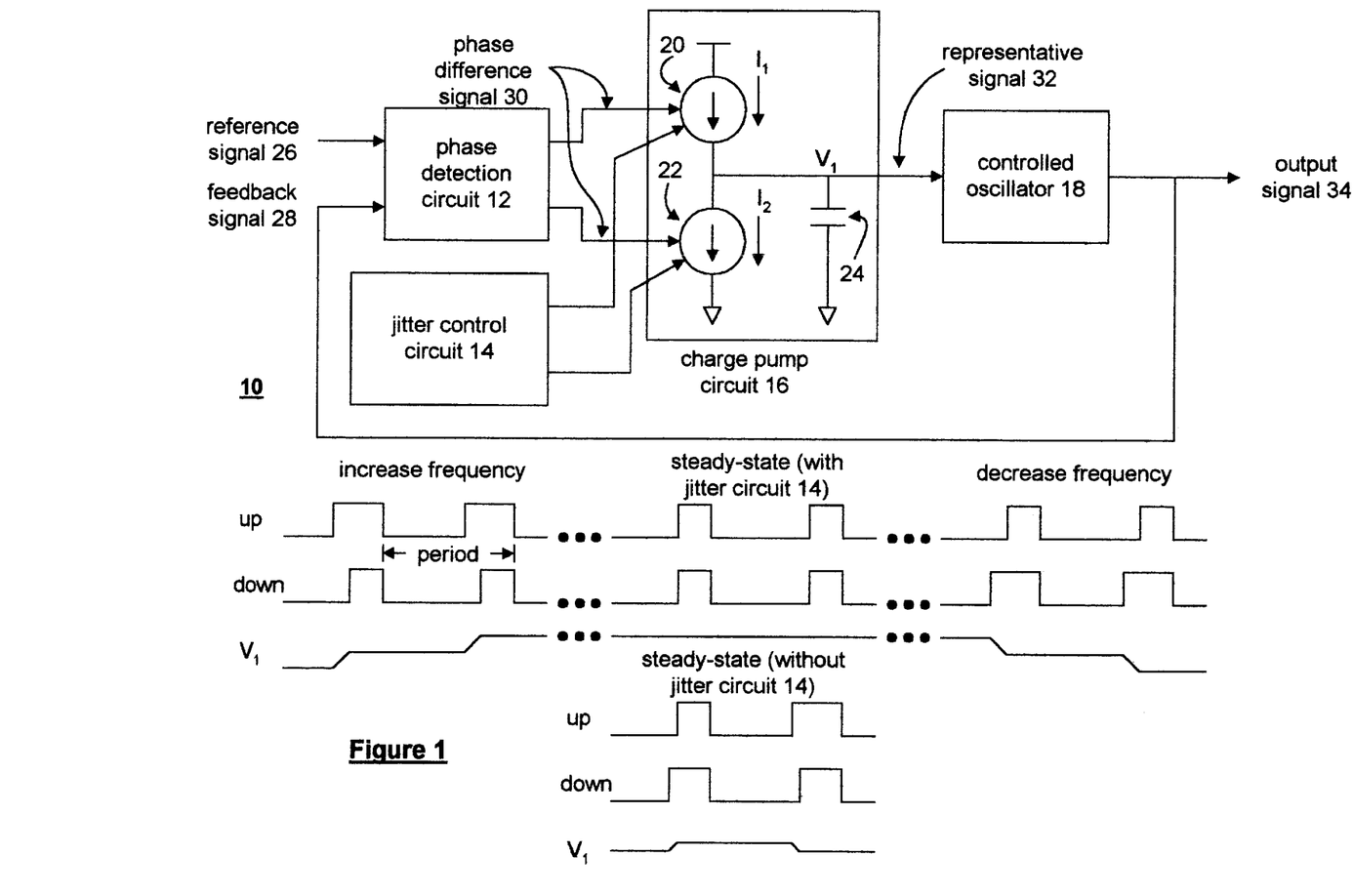
FIG. 1 illustrates a schematic block diagram of a phase lock loop in accordance with the present invention.

The present invention can be more fully described with reference to FIGS. 1 through 4. FIG. 1 illustrates a schematic block diagram of phase lock loop 10 that includes a phase detection circuit 12, a jitter control circuit 14, a charge pump circuit 16, and a controlled oscillator 18. The phase detection circuit 12 is operably coupled to receive a reference signal 26 and a feedback signal 28. The phase detection circuit 12 produces a phase difference signal 30 based on the phase difference between the referenced signal 26 and the feedback signal 28. Such functionality of a phase detection circuit is well known in the art, thus no further discussion will be presented except to further illustrate the present invention.

As shown, the phase difference signal 30 has two components. The first is provided to the first current source 20 of charge pump circuit 16 and the second is provided to the second current source 22 of the charge pump circuit 16. The timing diagram illustrates the resulting currents from the first current source 20 and the second current source 22 based on the phase different signals. When the output frequency is to be increased, the signal provided to the first current source 20 is longer than the signal provided to the second current source 22. As such, there is a period of time where only the first current source is providing current into the capacitor 24. As such, the voltage, or current, increases at the node thereby producing the representative charge up signal. When a steady state condition is reached, wherein the phase lock loop 10 includes the jitter circuit 14, the current provided by the first and second current sources 20 and 22 match such that the voltage across capacitor 24 remains substantially constant.

When the output frequency is to be decreased, the phase difference signal 30 provides a longer pulse to the second current source 22 than to the first current source 20. As such, the corresponding voltage across the capacitor 24 decreases, which corresponds to the representative signal 32.

The representative signal 32 may be a current signal or a voltage signal. In either case, when the representative signal 32 increases, the controlled oscillator 18 produces an increased output frequency signal 34. When the representative signal 32 decreases, the controlled oscillator 18 produces a lower frequency output signal 34. The construction of the controlled oscillator 18 may be a five inverter ring oscillator, or any other known implementation of a voltage or current controlled oscillator.

The jitter circuit 14 is operably coupled to the first and second current sources 20 and 22. The jitter control circuit 14 functions to cause the first and second currents $I_1$ and $I_2$ to substantially match. In this application, ideal current matching would result from ideal transistor components within the charge pump circuit and the jitter control circuit. However, such ideal components are not available, therefore substantially match refers to the closest matching possible given the components used. As such, substantially matched would be within a fraction of a percent.

The current and voltage diagram shown in FIG. 1 compares the difference of the phase lock loop with and without the jitter circuit 14. The top line shows the steady state condition when the PLL includes the jitter circuit. As shown, the jitter circuit causes the currents between of the first and second current sources to substantially match. The bottom portion reflects the steady state condition without the jitter circuit. As shown, in the first series of pulses, $I_2$ is slightly larger than $I_1$. This is common due to the fact that the second current source usually includes N-channel field effect transistors while the first current source 20 includes P-channel field effect transistors. In the next series of clock pulses, the phase different signal is adjusted, causing the first current source to produce a slightly larger current thereby achieving the steady state condition. But as shown, V1 fluctuates with each change of the phase different signal 30. Such a fluctuation causes jitter in the output frequency signal 34.

Figure 2:
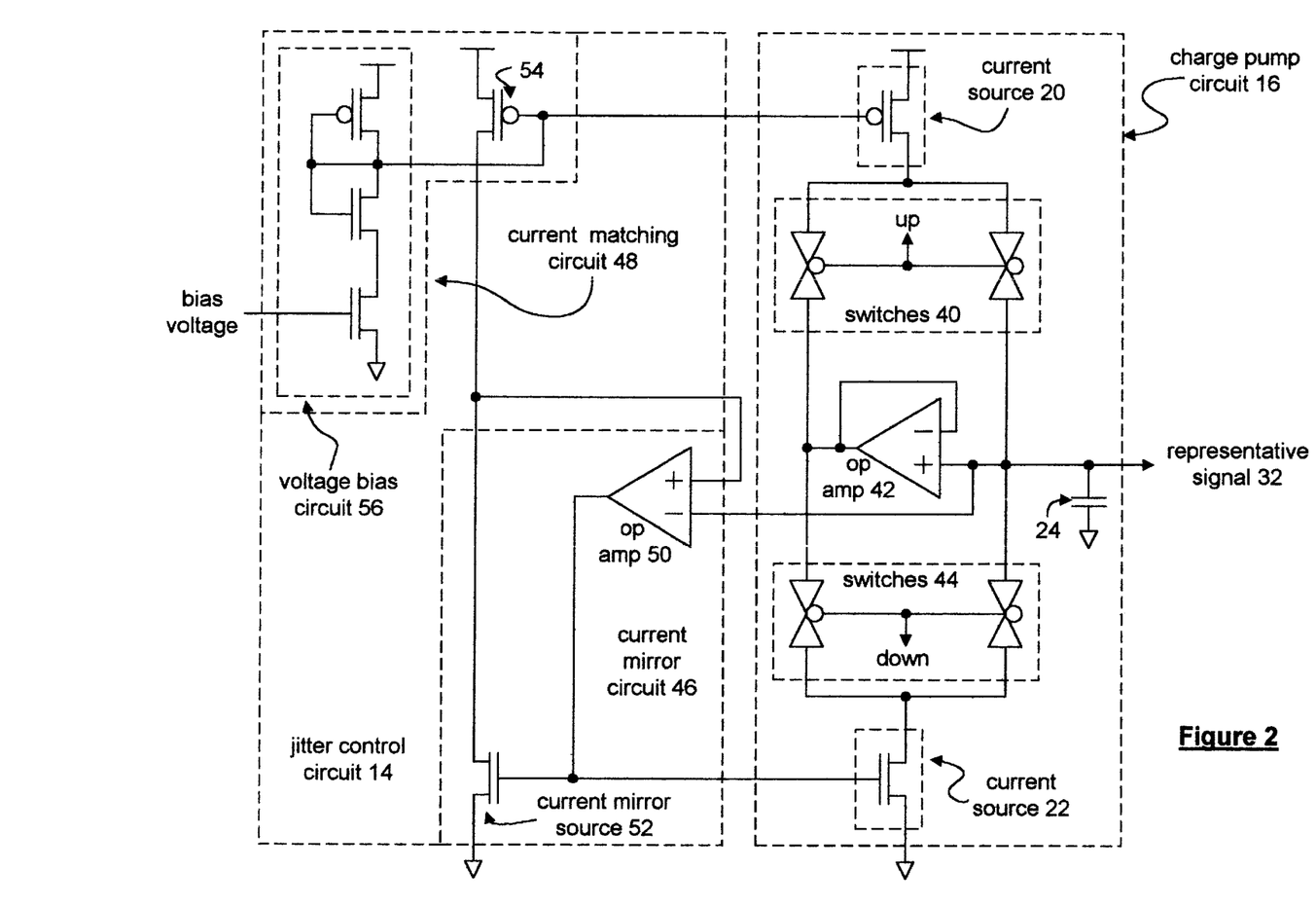
FIG. 2 illustrates a schematic block diagram of the jitter control circuit and charge pump circuit of the phase lock loop of FIG. 1.

FIG. 2 illustrates a schematic block diagram of the jitter control circuit 14 and the charge pump circuit 16. The jitter control circuit 14 includes a current mirror circuit 46 and a current matching circuit 48. The current mirror circuit 46 is operably coupled to mirror the current of the second current source of the charge pump circuit. The current matching circuit 48 is operably coupled in series with the current mirror circuit and is further operably coupled to the first current source. The current matching circuit provides a current that substantially matches the current of the mirror circuit and then impels the current of the first current source to substantially match the current of the current matching circuit. As such, by forcing the currents to match in this manner, the first current source 20 and the second source 22 are forced to match.

The charge pump circuit 16 includes the first current source 20, a first pair of switches 40, a second pair of switches 44, and an operational amplifier 42. An input of the operational amplifier 42 is coupled to a first node between the first and second pair of switches and an output of the operational amplifier 42 is coupled to a second node between the first and second pair of switches such that voltage at the first and second nodes substantially match. In a steady state condition, both the first and second current sources 20 and 22 will be activated for the same duration, as was discussed with reference to FIG. 1. As such, the up and down signals coupled to switches 40 and 44 will be active at the same time for the same duration. When this occurs, the first current source 20 sources current through the enabled switch of switches 40, the enabled switch of switches 44 and the second current source 22 sinks the current. Thus, little, if any current, flows into the capacitor 24, thereby maintaining a constant current and/or voltage. As such, the representative signal 32 remains constant.

To ensure that the current through the first current source 20 and the second current source 22 substantially match, the jitter control circuit forces the currents to match via the current matching circuit 48 and the current mirror circuit 46. The current mirror circuit 46 matches the current in the second current source. The current matching circuit 48, via a voltage biasing circuit 56 establishes a bias current within the current matching circuit. Since the current matching circuit is in series with the current mirror circuit, the current in the current mirror source 52 matches the current in transistor 54. As such, the current through the second current source matches the current as established by the current matching circuit 48. The current matching circuit is also operably coupled to the first current source 20 in a current mirroring manner. As such, the current matching circuit forces the current through the first current source 20 to substantially match the current through transistor 54. Further, since the current through transistor 54 matches the current through the current mirror source 52, which matches the current through the second current source 22, the current through the first current source 20 matches, or substantially matches, the current through the second current source 22. Thus, by causing the first and second current sources 20 and 22 to provide current that substantially match, the representative signal 32 will not change, or will change by negligible amounts, during steady state conditions, thereby reducing the jitter in the output frequency.

Figure 3:
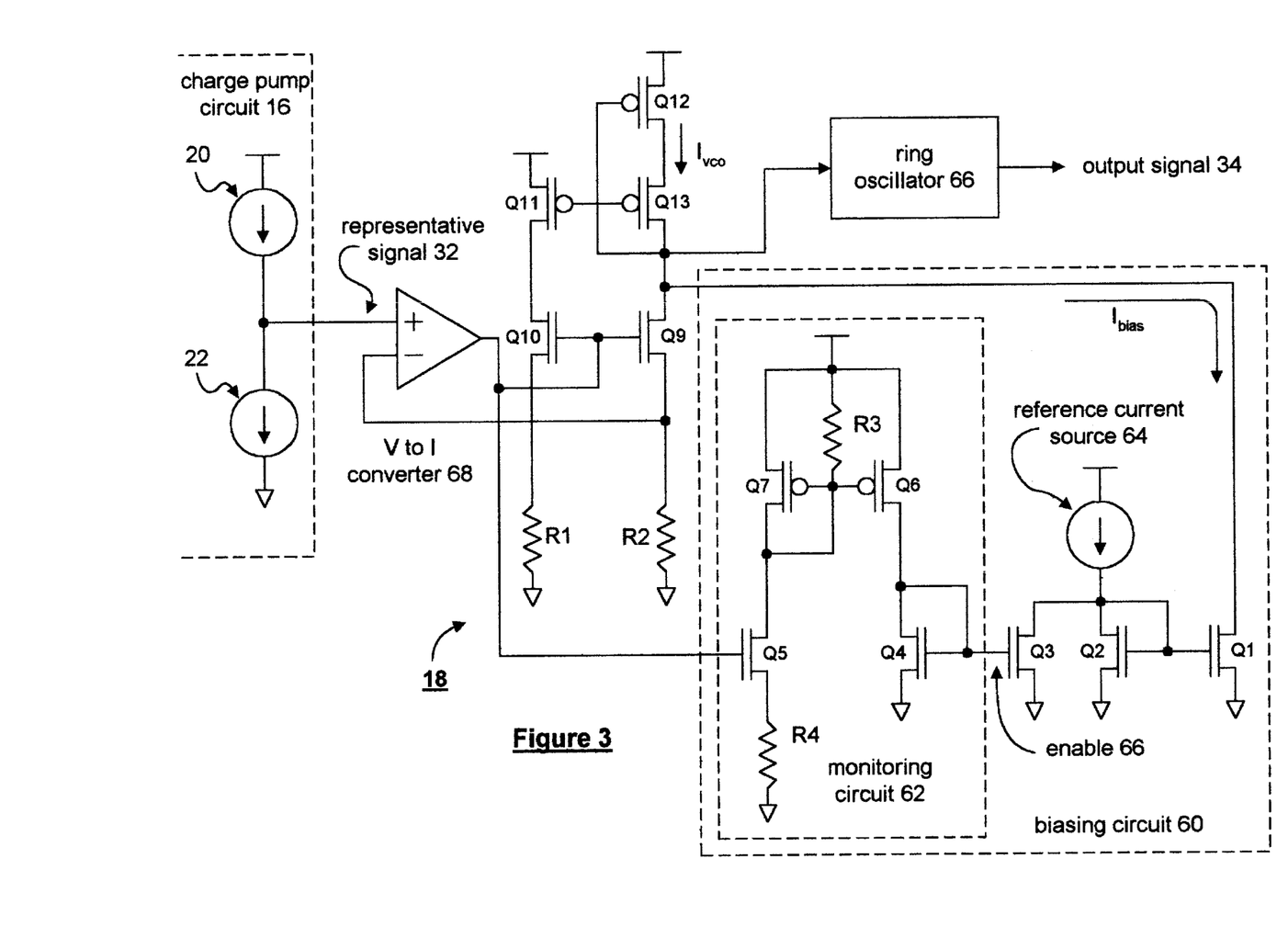
FIG. 3 illustrates a schematic block diagram of the controlled oscillation circuit of the phase lock loop of FIG. 1.

FIG. 3 illustrates a schematic block diagram of the controlled oscillator 18 that includes a biasing circuit 60. The controlled oscillator 18 is implemented as a voltage control oscillator. As such, it includes a voltage to current converter 68. In addition, the controlled oscillator includes the biasing circuits 60, a plurality of transistors, Q9 through Q13, a plurality of resistors, R1 and R2 and a ring oscillator 66. The biasing circuit 60 includes a reference current source 64, a monitoring circuit 62, a plurality of transistors Q1 through Q7, and a plurality of resistors R3 and R4.

In start up conditions, or large transitions in output frequency selections, the biasing circuit is active. Otherwise, the biasing circuit is inactive having negligible effect on the overall operation of the phase lock loop. During start up conditions, the representative signal is low. As such, the voltage across R1 and R2 is low and little or no current is flowing through Q9. To provide biasing, when the output of the voltage to current converter 68 is low, Q3 through 7 are off and Q1 and 2 are on. With Q1 active, a biasing current that substantially matches the referenced current produced by reference current source 64 is flowing through transistors Q12 and Q13. As such, a current and/or voltage is applied to the ring oscillator 66 thereby producing a minimum frequency output signal 34. As the output of the current to voltage converter increases, but remains below a threshold of the biasing circuit (e.g., 10 nanoamps to several microamps), has Q1 through Q7 in an active state. In addition, as the output of the current to voltage converter is increasing Q9 and Q10 are becoming active. Thus, the current $I_{VCO}$ through transistors Q12 and Q13 equal the summation of the bias current. As such, the output frequency of the ring oscillator is increasing from the minimum output frequency, which is established via the referenced current source 64.

Once the threshold is exceeded, Q3 through Q7 are active. With Q3 active, Q1 and Q2 are off. When Q1 is off, the biasing current is zero such that $I_{VCO}$ equals the current through Q9. Thus, the current through Q9 equals the voltage at the output of the current to voltage converter divided by the resistance of R2.

Figure 4:
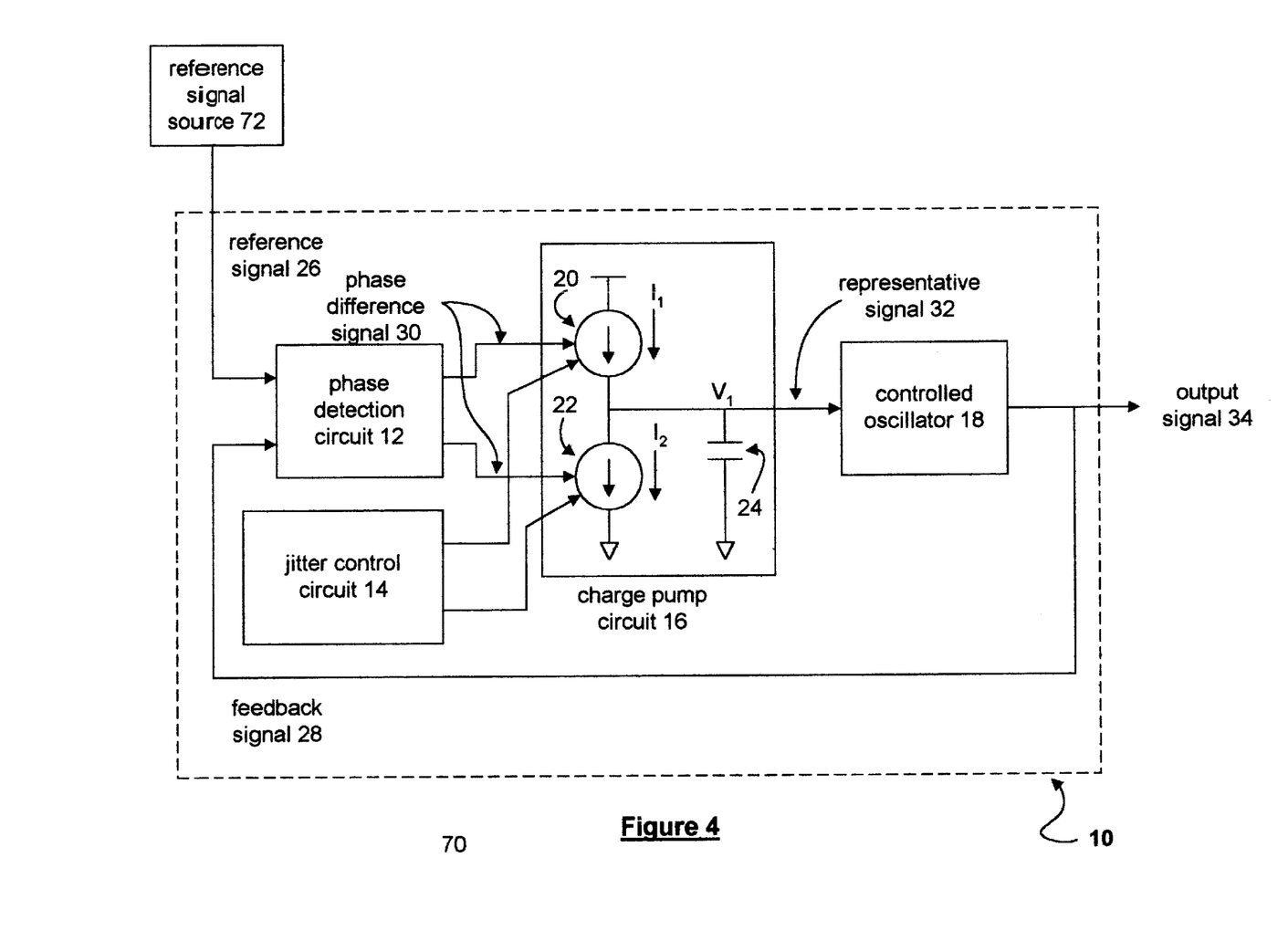
FIG. 4 illustrates a schematic block diagram of a low jitter clock circuit in accordance with the present invention.

FIG. 4 illustrates a schematic block diagram of a low jitter clock circuit 70 in accordance with the present invention. The low jitter clock circuit 70 includes a reference signal source 72 and the phase lock loop circuit 10. The details of the phase lock loop are as described with reference to FIGS. 1 through 3. The reference signal source 72 may be a crystal oscillator circuit, a data frequency extraction circuit, the output of another phase lock loop and/or any device that generates a clock signal.

The preceding discussion has presented a phase lock loop that has reduced jitter and/or frequency biasing. By incorporating the teachings of the present invention into a phase lock loop, a low jitter clock circuit may be derived as well as a clock circuit having a minimum output frequency during start up and transition times. As one of average skill in the art will appreciate, other embodiments may be derived from the teachings of the present invention without deviating from the spirit of the present invention.

What is claimed is:

1. A phase locked loop having reduces jitter, the phase locked loop comprises:
   a phase detection circuit operably coupled to receive a reference signal and a feedback signal, wherein the phase detection circuit produces a phase difference signal based on the reference signal and the feedback signal;
   a charge pump circuit operably coupled to receive the phase difference signal and to produce, therefrom, a representative signal, wherein the charge pump circuit includes a first current source and a second current source, wherein the first current source is dominate when the phase difference signal is in a first state and the second current source is dominate when the phase difference signal is in a second state;
   a controlled oscillator operably coupled to the charge pump circuit, wherein the controlled oscillator generates an output signal based on the representative signal, wherein the feedback signal is based on the output signal; and
   a jitter control circuit operably coupled to the first and second current sources, wherein the jitter control circuit impels currents to the first and second current sources to substantially match, and wherein the jitter control circuit comprises:
      a current mirror circuit operably coupled to mirror the current of the second current source; and
      a current matching circuit coupled in series with the current mirror circuit and operably coupled to the first current source, wherein the current matching circuit provides a current that substantially matches the current of the current mirror circuit and impels the current of the first current source to substantially match the current of the current matching circuit.

2. The phase locked loop of claim 1, wherein the charge pump circuit further includes a first pair of switches, a second pair of switches, and an operational amplifier, wherein an input of the operational amplifier is coupled to a first tap of the first pair of switches and an output of the operational amplifier is coupled to a second tap of the second pair of switches such that the voltage at the first and second taps substantially match; and
   wherein the current mirror circuit comprises:
      a mirror current source operably coupled to the second current source; and
      a second operational amplifier, wherein a first input of the second operational amplifier is coupled to a series mode of the jitter control circuit, a second input of the second operational amplifier, and an output of the second operational amplifier is operable couples to the mirror current source and the second current source.

3. A phase locked loop having reduced jitter, the phase locked loop comprised:
   a phase detection circuit operable coupled to receive a reference signal and a feedback signal, wherein the phase detection circuit produces a phase difference signal based on the reference signal and the feedback signal;
   a charge pump circuit operable coupled to receive the phase difference signal and to produce, therefrom, a representative signal, wherein the charge pump circuit includes a first current source and a second current source, wherein the first current source is dominate when the phase difference signal is in a first state and the second current source is dominate when the phase difference signal is in a second state;
   a controlled oscillator operable coupled to the charge pump circuit, wherein the controlled oscillator generates an output signal based on the representative signal, wherein the feedback signal is based on the output signal, and wherein the controlled oscillator comprises a biasing circuit operably coupled to provide a biasing signal when the reference signal has a frequency below a desired rate such that the output signal maintains a minimum frequency; and
   a jitter control circuit operably coupled to the first and second current sources, wherein the jitter control circuit impels currents of the first and second current sources to substantially match.

4. The phase locked loop of claim 3, wherein the biasing circuit further comprises:
   a monitoring circuit operably coupled to monitor the representative signal, wherein the monitoring circuit provides an enable signal when the representative signal is below a desired level; and
   a reference current source operably coupled to receive the enable signal, wherein the reference current source provides a reference current when the enable signal is active such that the output signal maintains the minimum frequency.

5. A phase locked loop having reduced jitter, the phase locked loop comprises:
   a phase detection circuit operably coupled to receive a reference signal and a feedback signal, wherein the phase detection circuit produces a phase difference signal based on the reference signal and the feedback signal;

a charge pump circuit operably coupled to receive the phase difference signal and to produce, therefrom, a representative signal, wherein the charge pump circuit includes a first current source and a second current source, wherein the first current source is dominate when the phase difference signal is in a first state and the second current source is dominate when the phase difference signal is in a second state; and a controlled oscillator operably coupled to the charge pump circuit, wherein the controlled oscillator generates an output signal based on the representative signal, wherein the feedback signal is based on the output signal, and wherein the controlled oscillator includes a biasing circuit operably coupled to provide a biasing signal when the reference signal has a frequency below a desired rate such that the output signal maintains a minimum frequency.

6. The phase locked loop of claim 5, wherein the biasing circuit further comprises:

a monitoring circuit operably coupled to monitor the representative signal, wherein the monitoring circuit provides an enable signal when the representative signal is below a desired level; and a reference current source operably coupled to receiving the enable signal, wherein the reference current source provides a reference current when the enable signal is active such that the output signal maintains the minimum frequency.

7. The phase locked loop of claim 6 further comprises a jitter control circuit operably coupled to the first and second current sources, wherein the jitter control circuit impels currents of the first and second current sources to substantially match.

8. The phase locked loop of claim 7, wherein the jitter control circuit further comprises:

a current mirror circuit operably coupled to mirror the current of the second current source; and a current matching circuit coupled in series with the current mirror circuit and operably coupled to the first current source, wherein the current matching circuit provides a current that substantially matches the:current of the current mirror circuit and impels the current of the first current source to substantially match the current of the current matching circuit.

9. The phase locked loop of claim 8, wherein the charge pump further includes a first pair of switches, a second pair of switches, and an operational amplifier, wherein an input of the operational amplifier is coupled to a first tap of the first pair of switches and an output of the operational amplifier is coupled to a second tap of the second pair of switches such that voltage at the first and second taps substantially match; and wherein the current mirror circuit comprises:

a mirror current source operably coupled to the second current source; and a second operational amplifier, wherein a first input of the second operational amplifier is coupled to a series node of the jitter control circuit, a second input of the second operational amplifier is coupled to the input of the operational amplifier, and an output of the second operational amplifier is operably coupled to the mirror current source and the second current source.

10. A low jitter clock circuit comprises;

a reference signal source that produces a reference signal; and a phase locked loop that includes;

a phase detection circuit operably coupled to receive the reference signal and a feedback signal, wherein the phase detection circuit produces a phase difference signal based on the reference signal and the feedback signal;

a charge pump circuit operable coupled to receive the phase difference signal and to produce, therefrom, a representative signal, wherein the charge pump circuit includes a first current source and a second current source, wherein the first current source is dominate when the phase difference signal is in a first state and the second current source is dominate when the phase difference signal is in a second state;

a controlled oscillator operably coupled to the charge pump circuit, wherein the controlled oscillator generates an output signal based on the representative signal, wherein the feedback signal is based on the output signal; and a jitter control circuit operably coupled to the first and second current sources, wherein the jitter control circuit impels currents of the first and second current sources to substantially match, and wherein the jitter control circuit comprises:

a current mirror circuit operably coupled to mirror the current of the second current source; and a current matching circuit coupled in series with the current mirror circuit and operably coupled to the first current source, wherein the current matching circuit provides a current that substantially matches the current of the current mirror circuit and impels the current if the first current source to substantially match the current of the current matching circuit.

11. The low jitter clock circuit of claim 10, wherein the charge pump circuit further includes a first pair of switches, a second pair of switches, and an operational amplifier is coupled to first tap of the first pair of switches and an output of the operational amplifier is coupled to a second tap of the second pair of switches such that the voltage at the first and second taps substantially match; and wherein the current mirror circuit comprises:

a mirror current source operably coupled to the second current source; and a second operational amplifier, wherein a first input of the second operational amplifier is coupled to a series node of the jitter control circuit, a second input of the second operational amplifier is coupled to the input of the operational amplifier, and an output of the second operational amplifier is operably coupled to the mirror current source and the second current source.

12. A low jitter clock circuit comprises;

a reference signal source that produces a reference signal; and a phase locked loop that includes;

a phase detection circuit operably coupled to receive the reference signal and a feedback signal, wherein the phase detection circuit produces a phase difference signal based on the reference signal and the feedback signal;

a charge pump circuit operably coupled to receive the phase difference signal and to produce, therefrom, a representative signal, wherein the charge pump circuit includes first current source and a second current source, wherein the first current source is dominate when the phase difference signal is in a first state and the second current source is dominate when the phase difference signal is in a second state;

a controlled oscillator operably coupled to the charge pump circuit, wherein the controlled oscillator generates an output signal based on the representative signal, wherein the feedback signal is based on the output signal, and wherein the controlled oscillator comprises a biasing circuit operably coupled to provide a biasing signal when the reference signal has a frequency below a desired rate such that the output signal maintains a minimum frequency; and a jitter control circuit operably coupled to the first and second current sources, wherein the jitter control circuit impels currents of the first and second current sources to substantially match.

13. The low jitter clock circuit of claim 12, wherein the biasing circuit further comprises:

a monitoring circuit operably coupled to monitor the representative signal, wherein the monitoring circuit provides an enable signal when the representative signal is below a desired level; and a reference current source operably coupled to receive the enable signal, wherein the reference current source provides a reference current when the enable signal is active such that the output signal maintains the minimum frequency.

\* \* \* \* \*

UNITED STATES PATENT AND TRADEMARK OFFICE
CERTIFICATE OF CORRECTION

| | | |
|---|---|---|
| PATENT NO. | : 6,526,111 B1 | |
| APPLICATION NO. | : 09/197615 | |
| DATED | : February 25, 2003 | |
| INVENTOR(S) | : Ammisetti V. Prasad et al. | |

It is certified that error appears in the above-identified patent and that said Letters Patent is hereby corrected as shown below:

In Column 5, Line 38, Claim No. 1:
  Change "reduces" to -- reduced --.

In Column 6, Line 18, Claim No. 2:
  Insert -- is coupled to the input of the operational amplifier -- between "amplifier" and ",and".

In Column 6, Line 19, Claim No. 2:
  Change "operable" to -- operably --.

In Column 6, Line 20, Claim No. 2:
  Change "couples" to -- coupled --.

In Column 6, Line 23, Claim No.3:
  Change "comprised" to -- comprises --.

In Column 8, Line 7, Claim No. 10:
  Change "operable" to -- operably --.

In Column 6, Line 18, Claim No. 2:
  Change "mode" to -- node --.

In Column 6, Line 24, Claim No. 3:
  Change "operable" to -- operably --.

In Column 6, Line 29, Claim No. 3:
  Change "operable" to -- operably --.

In Column 6, Line 37, Claim No. 3:
  Change "operable" to -- operably --.

Signed and Sealed this
First Day of March, 2011

David J. Kappos
*Director of the United States Patent and Trademark Office*

CERTIFICATE OF CORRECTION (continued)
U.S. Pat. No. 6,526,111 B1

In Column 8, Line 31, Claim No. 10:
    Change "if" to -- of --.

In Column 8, Line 35, Claim No. 11:
    Insert -- , wherein an input of the operational amplifier -- between "amplifier" and "is"

In Column 8, Line 36, Claim No. 11:
    Insert -- a -- between "coupled to" and "first tap".

In Column 8, Line 63, Claim No. 12:
    Insert -- a -- between "includes" and "first".